US012560662B2

(12) United States Patent
Nomura et al.

(10) Patent No.: US 12,560,662 B2
(45) Date of Patent: Feb. 24, 2026

(54) MAGNETIC PARTICLE IMAGING DEVICE

(71) Applicant: Mitsubishi Electric Corporation, Tokyo (JP)

(72) Inventors: Kota Nomura, Tokyo (JP); Tetsuya Matsuda, Tokyo (JP); Kazuki Yamauchi, Tokyo (JP); Masaomi Washino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 237 days.

(21) Appl. No.: 18/285,495

(22) PCT Filed: Mar. 29, 2022

(86) PCT No.: PCT/JP2022/015583
§ 371 (c)(1),
(2) Date: Oct. 4, 2023

(87) PCT Pub. No.: WO2022/220113
PCT Pub. Date: Oct. 20, 2022

(65) Prior Publication Data
US 2024/0111007 A1 Apr. 4, 2024

(30) Foreign Application Priority Data
Apr. 13, 2021 (JP) ................................. 2021-067605

(51) Int. Cl.
*G01R 33/12* (2006.01)

(52) U.S. Cl.
CPC ............................... *G01R 33/1276* (2013.01)

(58) Field of Classification Search
CPC .......................... G01R 33/1276; A61B 5/0515
See application file for complete search history.

(56) References Cited

U.S. PATENT DOCUMENTS

| | | | |
|---|---|---|---|
| 2008/0007258 A1 | 1/2008 | Bockstal | |
| 2010/0033172 A1* | 2/2010 | Gleich .................... | A61B 5/05 |
| | | | 324/228 |
| 2023/0184862 A1 | 6/2023 | Nomura et al. | |

FOREIGN PATENT DOCUMENTS

| | | | |
|---|---|---|---|
| EP | 3378389 A1 * | 9/2018 | ......... G01R 33/1276 |
| JP | H05-232202 A | 9/1993 | |
| | (Continued) | | |

OTHER PUBLICATIONS

Weber et al., "Implementation of a High-Precision 2-D Receiving Coil Set for Magnetic Particle Imaging," in IEEE Transactions on Magnetics, vol. 51, No. 2, pp. 1-4, Feb. 2015 (Year: 2015).*

(Continued)

*Primary Examiner* — Daniel R Miller
(74) *Attorney, Agent, or Firm* — XSENSUS LLP

(57) ABSTRACT

A pair of first measurement coils is disposed so as to sandwich magnetic particles. A pair of second measurement coils is disposed so as to sandwich magnetic particles and the pair of first measurement coils. A pair of alternate-current magnetic field application coils is disposed so as to sandwich magnetic particles, the pair of first measurement coils, and the pair of second measurement coils. A measurement device outputs a signal representing a difference between a signal measured by the pair of first measurement coils and a signal measured by the pair of second measurement coils.

20 Claims, 8 Drawing Sheets

(56)     References Cited

FOREIGN PATENT DOCUMENTS

| | | | |
|---|---|---|---|
| JP | 2008-519268 | A | 6/2008 |
| JP | 2010-172410 | A | 8/2010 |
| JP | 6844075 | B1 | 3/2021 |
| WO | 2006/050587 | A1 | 5/2006 |

OTHER PUBLICATIONS

Knopp et al., A Fourier slice theorem for magnetic particle imaging using a field-free line, Inverse Problems, vol. 27, No. 9, 2011 (Year: 2011).*

International Search Report and Written Opinion mailed on Jun. 21, 2022, received for PCT Application PCT/JP2022/015583, filed on Mar. 29, 2022, 9 pages including English Translation.

Murase et al., "Development of a system for magnetic particle imaging using neodymium magnets and gradiometer", Japanese Journal of Applied Physics, vol. 53, No. 067001, 2014, pp. 067001-1-067001-7.

* cited by examiner (a)

ALTERNATE-CURRENT MAGNETIC FIELD DIRECTION (b)

(a)

(b)

(a)

ALTERNATE-CURRENT
MAGNETIC FIELD
DIRECTION
3c,4c,5c (b)

MAGNETIC PARTICLE IMAGING DEVICE

CROSS-REFERENCE TO RELATED APPLICATIONS

This application is based on PCT filing PCT/JP2022/015583, filed Mar. 29, 2022, which claim priority from Japanese Patent Application No. 2021-067605, filed Apr. 13, 2021, the entire contents of each are incorporated herein by reference.

TECHNICAL FIELD

The present disclosure relates to a magnetic particle imaging device.

BACKGROUND ART

There is known a magnetic particle imaging device including an alternate-current magnetic field application coil and a direct-current magnetic field application unit. In this device, because only magnetic particles in a field-free region generated by the direct-current magnetic field application unit fluctuate in magnetization due to an excitation magnetic field, it is possible to obtain distribution information of the magnetic particles by scanning a relative position between a near field-free region and the magnetic particles. In a case where the near field-free region is formed linearly (FFL: Field Free Line), it is possible to integrate a signal in a linear region for measurement; therefore, a signal strength can be increased (see, for example, NPL 1).

CITATION LIST

Non Patent Literature

NPL 1: "Development of a system for magnetic particle imaging using neodymium magnets and gradiometer", Kenya Murase et al, Jpn. J. Appl. Phys. 53 067001 (2014)

SUMMARY OF INVENTION

Technical Problem

In the magnetic particle imaging device described in NPL 1, because the sensitivity center of the measurement coil and the linear position of linear near field-free region FFL cannot be determined in a mechanically structural manner, it is not easy to match the sensitivity center of the measurement coil and the position of linear near field-free region FFL. If the sensitivity center of the measurement coil does not coincide with the position of linear near field-free region FFL, the peak of the sensitivity cannot be obtained, and the detection accuracy is not high.

Therefore, an object of the present disclosure is to provide a magnetic particle imaging device having higher detection accuracy than before.

Solution to Problem

A magnetic particle imaging device on the present disclosure includes: a pair of alternate-current magnetic field application coils to excite an alternate-current magnetic field; a direct-current magnetic field applicator to generate a linear near field-free region such that magnetism of magnetic particles included in a test object is changed; and a magnetism change measurement device to measure a magnetism change in the magnetic particles. The magnetism change measurement device includes: a pair of first measurement coils; a pair of second measurement coils; and a measurement device. The pair of first measurement coils is disposed so as to sandwich the magnetic particles. The pair of second measurement coils is disposed so as to sandwich the magnetic particles and the pair of first measurement coils. The pair of alternate-current magnetic field application coils is disposed so as to sandwich the magnetic particles, the pair of first measurement coils, and the pair of second measurement coils. The measurement device outputs a signal representing a difference between a signal measured by the pair of first measurement coils and a signal measured by the pair of second measurement coils.

Advantageous Effects of Invention

In the magnetic particle imaging device of the present disclosure, the pair of first measurement coils is disposed so as to sandwich the magnetic particles, the pair of second measurement coils is disposed so as to sandwich the magnetic particles and the pair of first measurement coils, and the pair of alternate-current magnetic field application coils is disposed so as to sandwich the magnetic particles, the pair of first measurement coils, and the pair of second measurement coils. The measurement device outputs a signal representing a difference between a signal measured by the pair of first measurement coils and a signal measured by the pair of second measurement coils. The present disclosure makes it possible to determine the position of the sensitivity center of the measurement coil and the position of FFL in a mechanically structural manner; therefore, it is possible to achieve higher detection accuracy than before.

DESCRIPTION OF EMBODIMENTS

Embodiments will be described with reference to the drawings.

Reference Example

As a reference example, a magnetic particle imaging device described in NPL 1 will be described.

Figure 1:
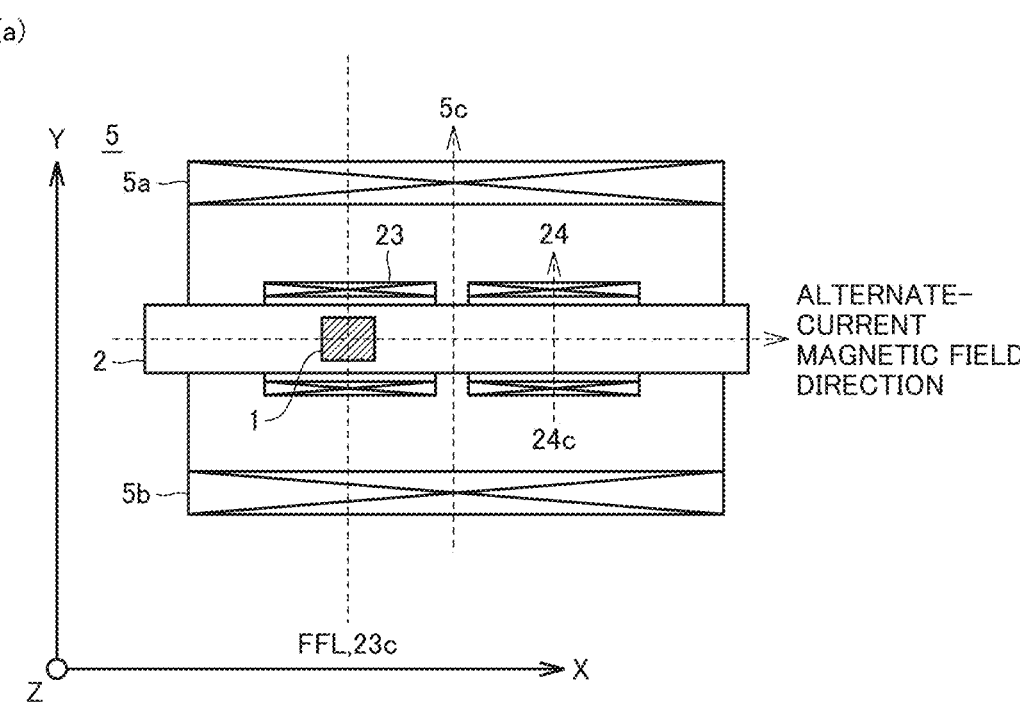
FIG. 1(a) is a diagram of an alternate-current magnetic field application coil and a pair of measurement coils of a reference example as viewed from a certain direction.
FIG. 1(b) is a diagram of the alternate-current magnetic field application coil and the pair of measurement coils of the reference example as viewed from another direction.
Figure 1:
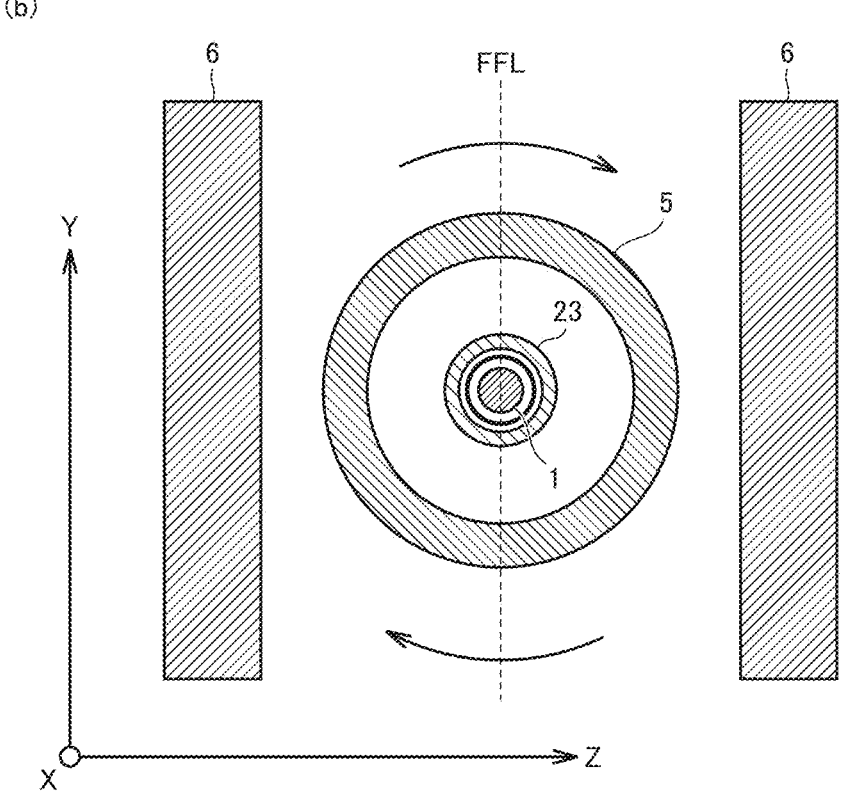

FIG. 1(*a*) is a diagram of an alternate-current magnetic field application coil and a pair of measurement coils of a reference example as viewed from a certain direction. FIG. 1(*b*) is a diagram of the alternate-current magnetic field application coil and the pair of measurement coils of the reference example as viewed from another direction.

A test object 2 includes magnetic particles 1. The pair of measurement coils includes a measurement coil 23 and a measurement coil 24. Directions of a central axis 5*c* of a pair of alternate-current magnetic field application coils 5, a central axis 23*c* of measurement coil 23, and a central axis 24*c* of measurement coil 24 are an X-axis direction. Magnetic particles 1 are disposed inside measurement coil 23. A direction of a line of a linear near field-free region FFL formed by the static magnetic field generator is the X-axis direction.

In order to perform magnetic particle imaging, the positions of the direct-current magnetic field applicator, the pair of alternate-current magnetic field application coils 5, measurement coil 23, and measurement coil 24 are changed so that a direction of the alternate-current magnetic field and linear near field-free region FFL rotate on an XZ plane.

In the reference example, the direction of the alternate-current magnetic field is perpendicular to the direction of the line of linear near field-free region FFL. In the reference example, in a case where the direction of the alternate-current magnetic field and the direction of the line of linear near field-free region FFL are disposed to be parallel to each other, there arises a following problem. If the direction of the alternate-current magnetic field and linear near field-free region FFL are rotated in order to perform magnetic particle imaging, each component collides with test object 2. Therefore, in a case where the magnetic particle imaging device is configured as in the reference example, the direction of the alternate-current magnetic field and the direction of the line of linear near field-free region FFL cannot be made parallel to each other.

As in the reference example, in the case where the direction of the alternate-current magnetic field is perpendicular to the direction of the line of linear near field-free region FFL, there is a problem that linear near field-free region FFL vibrates. This is because linear near field-free region FFL is interfered by the alternate-current magnetic field being applied in the same direction as the magnetic fields that cancel each other.

Furthermore, as described above, in the reference example, because a sensitivity center of the measurement coil and the position of linear near field-free region FFL cannot be determined in a mechanically structural manner, it is not easy to match the sensitivity center of the measurement coil and the position of linear near field-free region FFL.

First Embodiment

Figure 2:
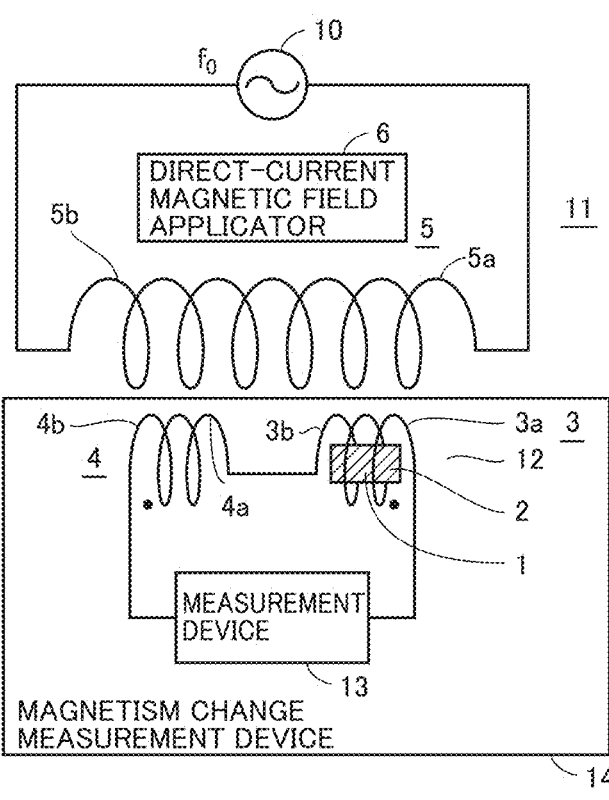
FIG. 2 is a diagram illustrating a configuration of a magnetic particle imaging device of an embodiment.

FIG. 2 is a diagram illustrating a configuration of a magnetic particle imaging device of an embodiment. The magnetic particle imaging device includes a direct-current magnetic field applicator 6, an alternate-current magnetic field applicator 11, and a magnetism change measurement device 14.

Direct-current magnetic field applicator 6 generates a linear near field-free region FFL to change the magnetism of magnetic particles 1 included in test object 2. Direct-current magnetic field applicator 6 forms linear near field-free region FFL in an imaging region where test object 2 is placed. Specifically, direct-current magnetic field applicator 6 includes, for example, two permanent magnets disposed to face each other with magnetization directions of the permanent magnets reversed to each other. Alternatively, direct-current magnetic field applicator 6 may include two yoked permanent magnets or electromagnets whose magnetizations are made to face each other by yokes.

Alternate-current magnetic field applicator 11 applies an alternate-current magnetic field to the imaging region where test object 2 is placed. Alternate-current magnetic field applicator 11 specifically includes: an alternate-current power supply 10; and a pair of alternate-current magnetic field application coils 5 that is connected to alternate-current power supply 10 to excite the alternate-current magnetic field. In FIG. 2, the pair of alternate-current magnetic field application coils 5 includes alternate-current magnetic field application coils 5*a* and 5*b* connected in series.

Magnetism change measurement device 14 measures a magnetism change in the magnetic particles. Magnetism change measurement device 14 includes a pair of first measurement coils 3, a pair of second measurement coils 4, and a measurement device 13. In FIG. 2, the pair of first measurement coils 3 includes first measurement coils 3*a* and 3*b* connected in series, and the pair of second measurement coils 4 includes second measurement coils 4*a* and 4*b* connected in series.

A winding direction of first measurement coils 3*a* and 3*b* constituting the pair of first measurement coils 3 and a winding direction of second measurement coils 4*a* and 4*b* constituting the pair of second measurement coils 4 are opposite to each other.

When magnetic particle imaging is performed, a measurement position is scanned by changing a relative position of linear near field-free region FFL, with respect to test object 2, formed by direct-current magnetic field applicator 6. In order to change the relative position, there are two methods. In one method, direct-current magnetic field applicator 6, the pair of alternate-current magnetic field application coils 5, the pair of first measurement coils 3, and the pair of second measurement coils 4 are mechanically moved, and, in the other method, test object 2 is mechanically moved.

A signal generated in the pair of first measurement coils 3 by alternate-current magnetic field applicator 11 is assumed to be AC1.

A signal generated in the pair of second measurement coils 4 by alternate-current magnetic field applicator 11 is assumed to be AC2.

A signal generated in the pair of first measurement coils 3 by magnetic particles 1 is assumed to be M1.

A signal generated in the pair of second measurement coils 4 by magnetic particles 1 is assumed to be M2.

A signal V1 generated by the pair of first measurement coils 3 is expressed as follows.

$$V1=AC1+M1 \tag{1}$$

A signal V2 generated by the pair of second measurement coils 4 is expressed as follows.

$$V2=AC2+M2 \tag{2}$$

Measurement device 13 outputs a signal $\Delta V$ representing a difference between the signal V1 generated by the pair of first measurement coils 3 and the signal V2 generated by the pair of second measurement coils 4.

$$\Delta V=V1-V2=(AC1+M1)-(AC2+M2) \tag{3}$$

Figure 3:
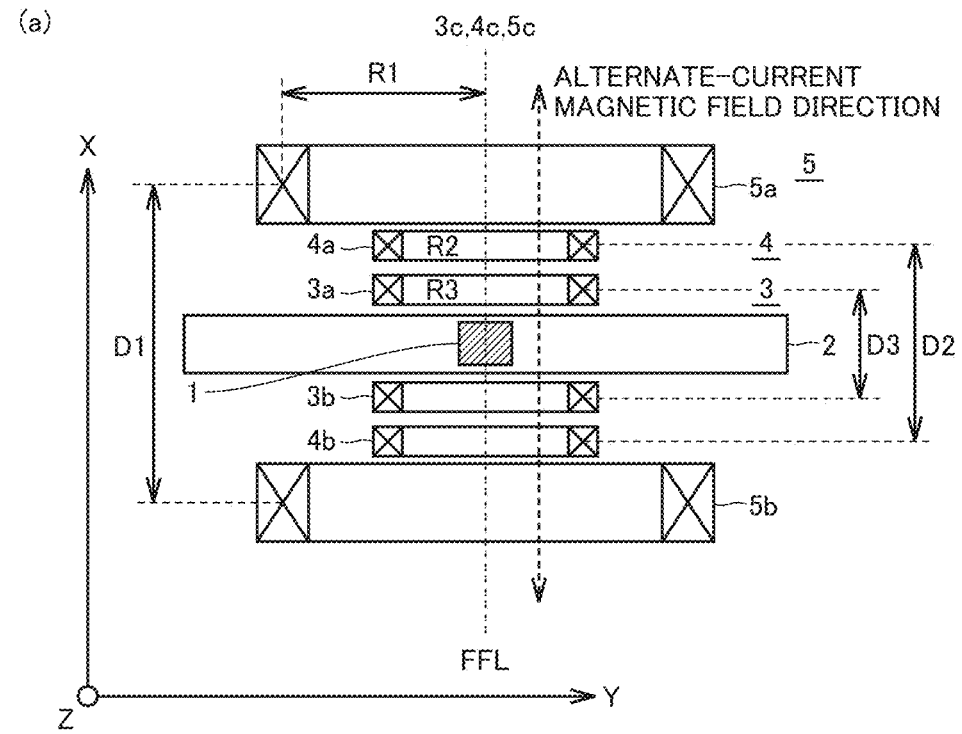
FIG. 3(a) is a diagram of a pair of alternate-current magnetic field application coils 5, a pair of first measurement coils 3, and a pair of second measurement coils 4 of a first embodiment as viewed from a certain direction.
FIG. 3(b) is a diagram of the pair of alternate-current magnetic field application coils 5, the pair of first measurement coils 3, and the pair of second measurement coils 4 of the first embodiment as viewed from another direction.
Figure 3:
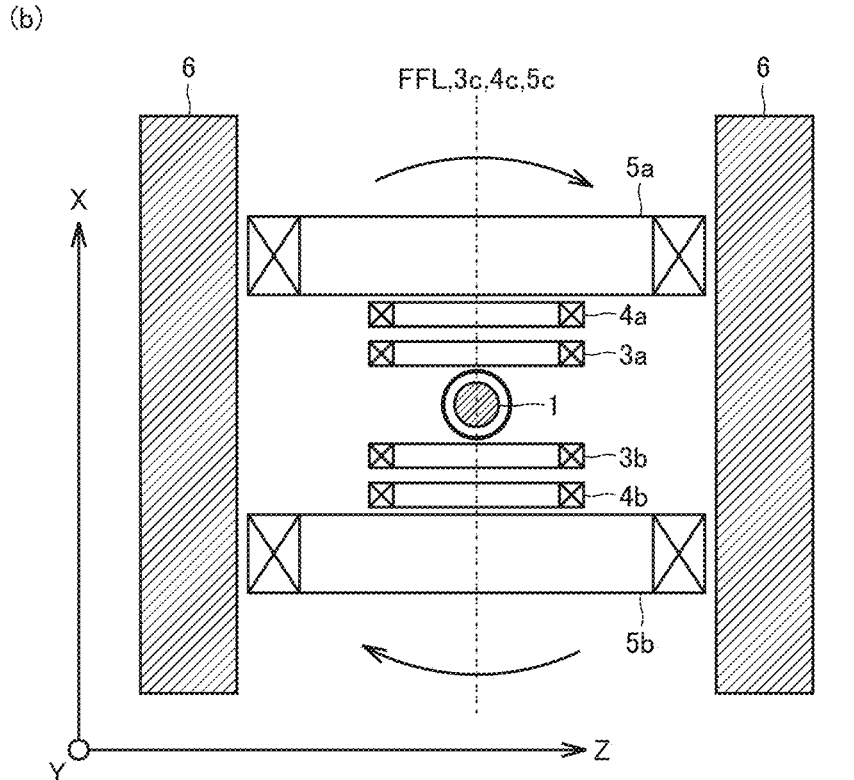

FIG. 3(*a*) is a diagram of the pair of alternate-current magnetic field application coils 5, the pair of first measurement coils 3, and the pair of second measurement coils 4 of the first embodiment as viewed from a certain direction. FIG. 3(*b*) is a diagram of the pair of alternate-current magnetic field application coils 5, the pair of first measurement coils 3, and the pair of second measurement coils 4 of the first embodiment as viewed from another direction.

The pair of first measurement coils 3 is disposed so as to sandwich magnetic particles 1 and test object 2 including magnetic particles 1. The pair of first measurement coils 3 includes first measurement coils 3*a* and 3*b*. First measurement coil 3*a* and first measurement coil 3*b* sandwich magnetic particles 1 and test object 2.

The pair of second measurement coils 4 is disposed so as to sandwich magnetic particles 1, test object 2, and the pair of first measurement coils 3. The pair of second measurement coils 4 includes second measurement coils 4*a* and 4*b*. Second measurement coil 4*a* and second measurement coil 4*b* sandwich magnetic particles 1, test object 2, first measurement coil 3*a*, and first measurement coil 3*b*.

The pair of alternate-current magnetic field application coils 5 is disposed so as to sandwich magnetic particles 1, test object 2, the pair of first measurement coils 3, and the pair of second measurement coils 4. The pair of alternate-current magnetic field application coils 5 includes alternate-current magnetic field application coils 5*a* and 5*b*. Alternate-current magnetic field application coil 5*a* and alternate-current magnetic field application coil 5*b* sandwich magnetic particles 1, test object 2, first measurement coil 3*a*, first measurement coil 3*b*, second measurement coil 4*a*, and second measurement coil 4*b*.

A directions of a central axis 5*c* of the pair of alternate-current magnetic field application coils 5, a central axis 3*c* of the pair of first measurement coils 3, and a central axis 4*c* of the pair of second measurement coils 4 are a first direction (X-axis direction). Preferably, central axis 5*c*, central axis 3*c*, and central axis 4*c* are common. A direction of the alternate-current magnetic field is the first direction (X-axis direction). Axes perpendicular to the X-axis are a Y axis and a Z-axis. FIG. 3(*a*) is a diagram illustrating an XY plane (Z=0) including the X-axis and the Y-axis. FIG. 3(*b*) is a diagram illustrating an XZ plane (Y=0) including the X-axis and the Z-axis.

A direction of a line of linear near field-free region FFL formed by direct-current magnetic field applicator 6 and the first direction (X-axis direction) can be substantially parallel to each other. That is, an angle formed by the direction of the line of linear near field-free region FFL and the first direction (X-axis direction) can be in a range of 5°. More preferably, the direction of the line of linear near field-free region FFL may be the first direction (X-axis direction). Furthermore, a basic position of linear near field-free region FFL overlaps with the common central axis 5*c* (=3*c*, 4*c*).

A distance between alternate-current magnetic field application coil 5*a* and alternate-current magnetic field application coil 5*b* is D1. A distance between second measurement coil 4*a* and second measurement coil 4*b* is D2. The distance between first measurement coil 3*a* and first measurement coil 3*b* is D3. Note that a relationship D1>D2>D3 is held. Coil radii of alternate-current magnetic field application coil 5*a* and alternate-current magnetic field application coil 5*b* are R1. Coil radii of second measurement coil 4*a* and second measurement coil 4*b* are R2. Coil radii of first measurement coil 3*a* and first measurement coil 3*b* are R3. Note that a relationship R1>R2=R3 is held.

In order to perform magnetic particle imaging, direct-current magnetic field applicator 6, the pair of alternate-current magnetic field application coils 5, the pair of first measurement coils 3, and the pair of second measurement coils 4 are configured to be rotatable in the XZ plane so that central axes 3*c*, 4*c*, and 5*c* of the coils, a direction of the alternate-current magnetic field, and linear near field-free region FFL rotate on the XZ plane. Alternatively, test object 2 including magnetic particles 1 may rotate in the XZ plane.

In order to perform magnetic particle imaging, direct-current magnetic field applicator 6 is moved so that linear near field-free region FFL further performs, in addition to rotation, a parallel shift to right and left centering on the basic position.

Figure 4:
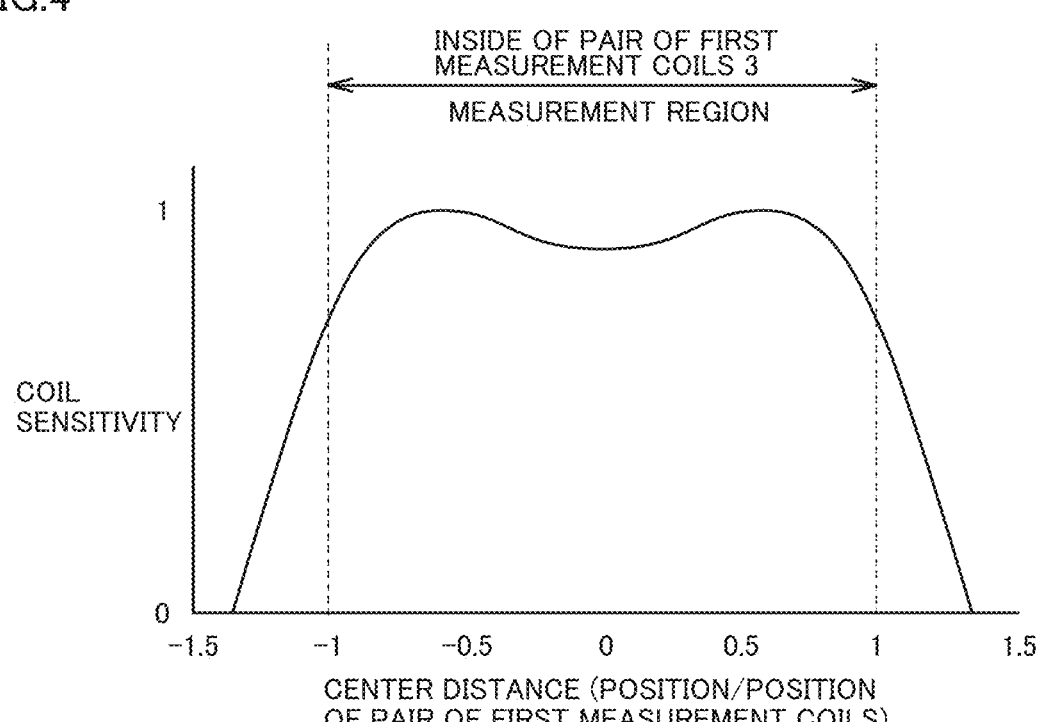
FIG. 4 is a diagram illustrating a coil sensitivity at each position.

FIG. 4 is a diagram illustrating a coil sensitivity at each position.

The coil sensitivity represents a magnitude of an excited magnetic field when a current flows through a coil, and represents a degree of influence of an induced voltage generated in the coil with respect to a change in a magnetic field generated at each position. As illustrated in FIG. 4, the coil sensitivity increases in the measurement region inside the pair of first measurement coils 3.

In the magnetic particle imaging device of the first embodiment, the direction of the line of linear near field-free region FFL and the direction of the alternate-current magnetic field are substantially parallel to each other. Furthermore, in the magnetic particle imaging device of the first embodiment, it is possible to easily match the sensitivity center of the measurement coil and the position of linear near field-free region FFL. Therefore, the magnetic particle imaging device of the first embodiment has higher detection accuracy than before.

Second Embodiment

Figure 5:
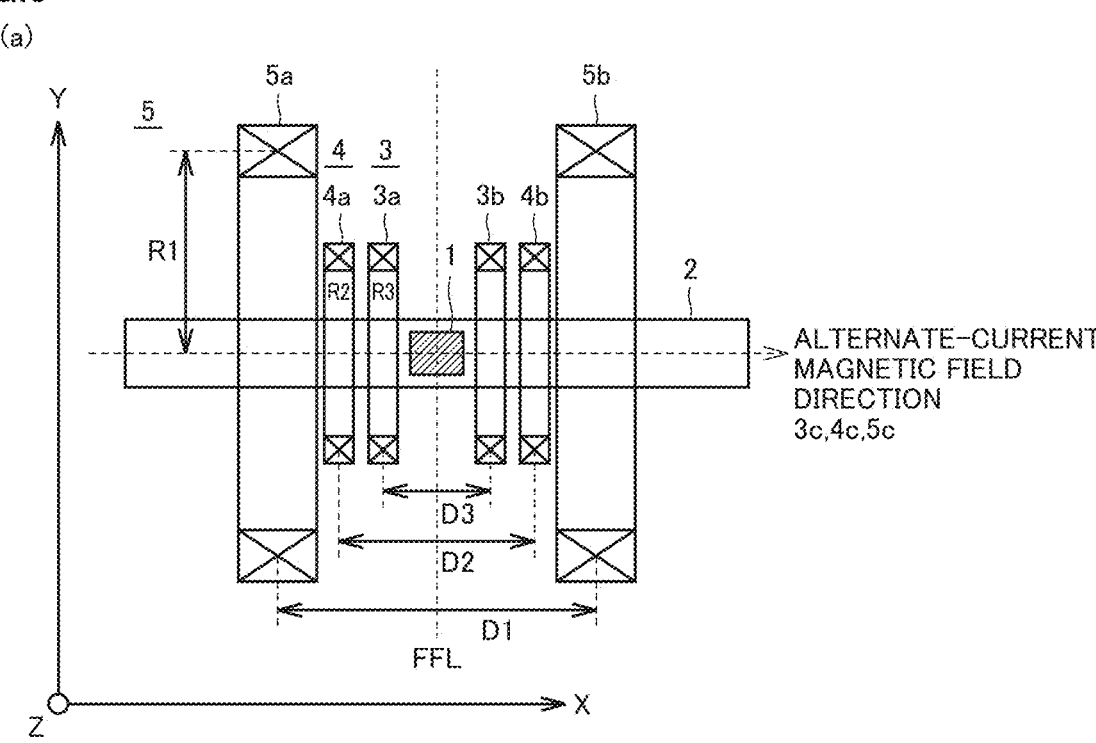
FIG. 5(a) is a diagram of a pair of alternate-current magnetic field application coils 5, a pair of first measurement coils 3, and a pair of second measurement coils 4 of a second embodiment as viewed from a certain direction.
FIG. 5(b) is a diagram of a pair of alternate-current magnetic field application coils 5, a pair of first measurement coils 3, and a pair of second measurement coils 4 of the second embodiment as viewed from another direction.
Figure 5:
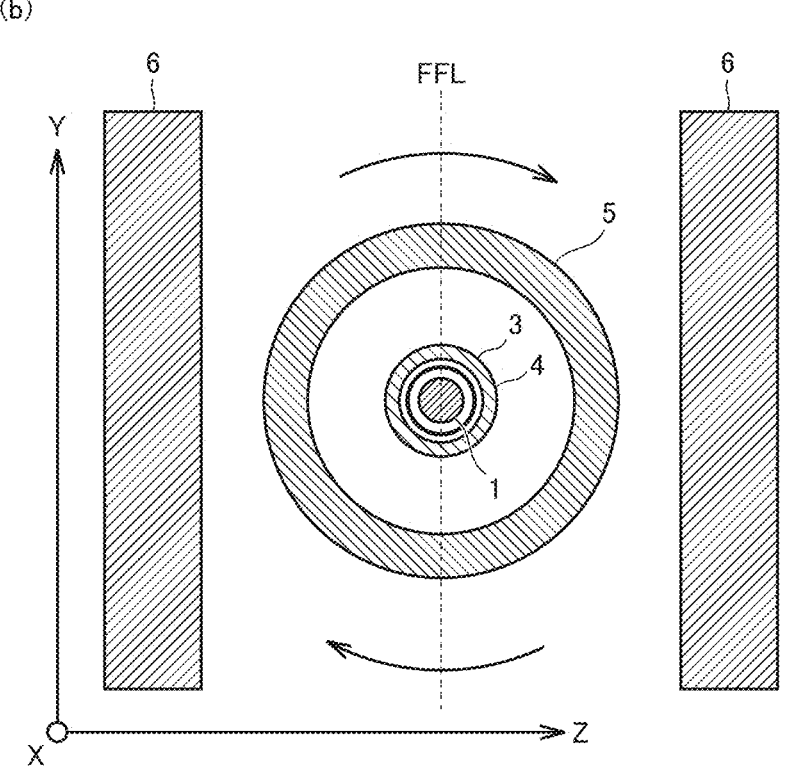

FIG. 5(*a*) is a diagram of a pair of alternate-current magnetic field application coils 5, a pair of first measurement coils 3, and a pair of second measurement coils 4 of a second embodiment as viewed from a certain direction. FIG. 5(*b*) is a diagram of the pair of alternate-current magnetic field application coils 5, the pair of first measurement coils 3, and the pair of second measurement coils 4 of the second embodiment as viewed from another direction.

The pair of first measurement coils 3 is disposed so as to sandwich magnetic particles 1. The pair of first measurement coils 3 includes first measurement coils 3a and 3b. First measurement coil 3a and first measurement coil 3b sandwich magnetic particles 1.

The pair of second measurement coils 4 is disposed so as to sandwich magnetic particles 1, and the pair of first measurement coils 3. The pair of second measurement coils 4 includes second measurement coils 4a and 4b. Second measurement coil 4a and second measurement coil 4b sandwich magnetic particles 1, first measurement coil 3a, and first measurement coil 3b.

The pair of alternate-current magnetic field application coils 5 is disposed so as to sandwich magnetic particles 1, the pair of first measurement coils 3, and the pair of second measurement coils 4. The pair of alternate-current magnetic field application coils 5 includes alternate-current magnetic field application coils 5a and 5b. Alternate-current magnetic field application coil 5a and alternate-current magnetic field application coil 5b sandwich magnetic particles 1, first measurement coil 3a, first measurement coil 3b, second measurement coil 4a, and second measurement coil 4b.

A directions of a central axis 5c of the pair of alternate-current magnetic field application coils 5, a central axis 3c of the pair of first measurement coils 3, and a central axis 4c of the pair of second measurement coils 4 are a first direction (X-axis direction). Preferably, central axis 5c, central axis 3c, and central axis 4c are common. A direction of the alternate-current magnetic field is the first direction (X-axis direction). Axes perpendicular to the X-axis are a Y axis and a Z-axis. FIG. 5(a) is a diagram illustrating an XY plane (Z=0) including the X-axis and the Y-axis. FIG. 5(b) is a diagram illustrating a YZ plane (X=0) including the Y-axis and the Z-axis.

A direction of a line of linear near field-free region FFL formed by direct-current magnetic field applicator 6 and the first direction (X-axis direction) can be substantially perpendicular to each other. That is, an angle formed by the direction of the line of linear near field-free region FFL and the first direction (X-axis direction) can be in a range of 90°±5°. More preferably, the direction of the line of linear near field-free region FFL may be the second direction (Y-axis direction).

A distance between alternate-current magnetic field application coil 5a and alternate-current magnetic field application coil 5b is D1. A distance between second measurement coil 4a and second measurement coil 4b is D2. The distance between first measurement coil 3a and first measurement coil 3b is D3. Note that a relationship D1>D2>D3 is held. Coil radii of alternate-current magnetic field application coil 5a and alternate-current magnetic field application coil 5b are R1. Coil radii of second measurement coil 4a and second measurement coil 4b are R2. Coil radii of first measurement coil 3a and first measurement coil 3b are R3. Note that a relationship R1>R2=R3 is held.

In order to perform magnetic particle imaging, direct-current magnetic field applicator 6, the pair of alternate-current magnetic field application coils 5, the pair of first measurement coils 3, and the pair of second measurement coils 4 are configured to be rotatable in the YZ plane so that central axes 3c, 4c, and 5c of the coils, a direction of the alternate-current magnetic field, and linear near field-free region FFL rotate on the YZ plane. Alternatively, test object 2 including magnetic particles 1 may rotate in the YZ plane.

In order to perform magnetic particle imaging, direct-current magnetic field applicator 6 is moved so that linear near field-free region FFL further performs, in addition to rotation, a parallel shift to right and left centering on the basic position.

In the magnetic particle imaging device of the second embodiment, the direction of the line of linear near field-free region FFL and the direction of the alternate-current magnetic field are substantially perpendicular to each other. However, in the magnetic particle imaging device of the second embodiment, it is possible to easily match the sensitivity center of the measurement coil and the position of linear near field-free region FFL. Therefore, the magnetic particle imaging device of the second embodiment has higher detection accuracy than before.

Third Embodiment

A third embodiment relates to a feature that the magnetic particle imaging devices of the first embodiment and the second embodiment further have.

Figure 6:
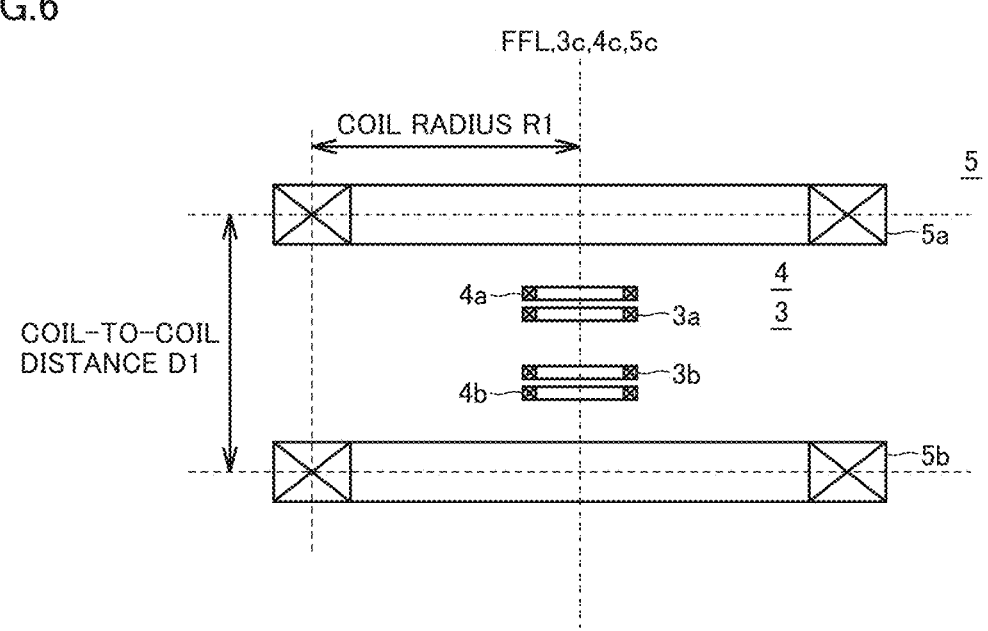
FIG. 6 is a diagram illustrating a pair of alternate-current magnetic field application coils 5, a pair of first measurement coils 3, and a pair of second measurement coils 4 of a third embodiment.

FIG. 6 is a diagram illustrating a pair of alternate-current magnetic field application coils 5, a pair of first measurement coils 3, and a pair of second measurement coils 4 of the third embodiment.

The pair of alternate-current magnetic field application coils 5 is a Helmholtz coil. That is, a radius R1 of an alternate-current magnetic field application coil 5a and an alternate-current magnetic field application coil 5b are equal to a distance D1 between alternate-current magnetic field application coil 5a and alternate-current magnetic field application coil 5b. As a result, a magnetic field in the vicinity of a center of a space sandwiched by alternate-current magnetic field application coil 5a and alternate-current magnetic field application coil 5b is uniform.

Configurations (numbers of turns, radii of coils, and the like) of a first measurement coil 3a and a first measurement coil 3b constituting the pair of first measurement coils 3, and a second measurement coil 4a and a second measurement coil 4b constituting the pair of second measurement coils 4 are the same. When first measurement coil 3a, first measurement coil 3b, second measurement coil 4a, and second measurement coil 4b are disposed in a space sandwiched between alternate-current magnetic field application coil 5a and alternate-current magnetic field application coil 5b, an amount of magnetic flux interlinking the pair of first measurement coils 3 and an amount of magnetic flux interlinking the pair of second measurement coils 4 are the same due to magnetic field uniformity of the Helmholtz coil.

With the present embodiment, because the uniformity of alternate-current magnetic field on linear near field-free region FFL and on the axes 3c, 4c, and 5c of the coils is improved, it is possible to suppress positional dependence, of a signal from the magnetic particles, caused by an alternate-current magnetic field distribution.

Fourth Embodiment

A fourth embodiment relates to a feature that the magnetic particle imaging devices of the first to third embodiments further have.

Figure 7:
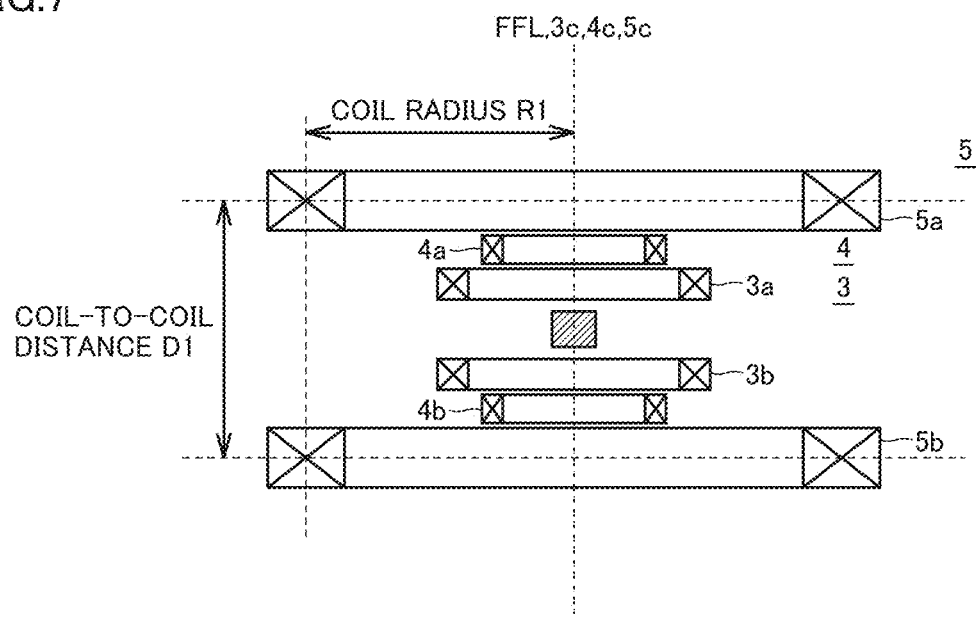
FIG. 7 is a diagram illustrating a pair of alternate-current magnetic field application coils 5, a pair of first measurement coils 3, and a pair of second measurement coils 4 of a fourth embodiment.

FIG. 7 is a diagram illustrating a pair of alternate-current magnetic field application coils 5, a pair of first measurement coils 3, and a pair of second measurement coils 4 of the fourth embodiment.

Even when the pair of alternate-current magnetic field application coils 5 is a Helmholtz coil as in the third embodiment, a completely uniform magnetic field is not necessarily generated in the space sandwiched between alternate-current magnetic field application coils 5a and 5b. Noise is mixed in the signal AC1 and the signal AC2 respectively generated in the pair of first measurement coils 3 and the pair of second measurement coils 4 by alternate-current magnetic field applicator 11.

A signal measured by a coil is proportional to a number of turns of the coil and a cross-sectional area of the coil; therefore, in order to remove noise, the number of turns of the coil or the cross-sectional area of the coil may be adjusted.

Second measurement coil 4a is closer to alternate-current magnetic field application coil 5a than first measurement coil 3a is, and second measurement coil 4b is closer to alternate-current magnetic field application coil 5b than first measurement coil 3b is. Therefore, if a number of turns N2 and a cross-sectional area S2 of second measurement coils 4a and 4b are the same as a number of turns N3 and a cross-sectional area S3 of first measurement coils 3a and 3b, a relationship AC2>AC1 is held.

In the present embodiment, the cross-sectional area S2 of second measurement coils 4a and 4b is made smaller than the cross-sectional area S3 of first measurement coils 3a and 3b so that an equation AC2=AC1 is satisfied. Specifically, in the present embodiment, a position of the pair of first measurement coils 3, a position of the pair of second measurement coils 4, the cross-sectional area of each coil of the pair of first measurement coils 3, and the cross-sectional area of each coil of the pair of second measurement coils 4 are adjusted so that an interlinkage magnetic flux of the pair of first measurement coils 3 and an interlinkage magnetic flux of the pair of second measurement coils 4 that are caused by the alternate-current magnetic field generated by the pair of alternate-current magnetic field application coils 5 are equal to each other. As a result, the differential voltage ΔV is as follows.

$$\Delta V = M1 - M2 \qquad (4)$$

Further, since the cross-sectional area S2 of second measurement coils 4a and 4b is smaller than the cross-sectional area S3 of first measurement coils 3a and 3b, M1 is larger, and M2 is smaller. As a result, ΔV can be larger.

The present embodiment makes it possible to reduce the signal caused by the alternate-current field, which signal causes noise, and to increase the signal strength caused by magnetization fluctuation of the magnetic particles, which magnetization fluctuation is a target of measurement. As a result, an S/N can be remarkably improved.

Fifth Embodiment

A fifth embodiment relates to a feature that the magnetic particle imaging devices of the first to fourth embodiments further have.

Figure 8:
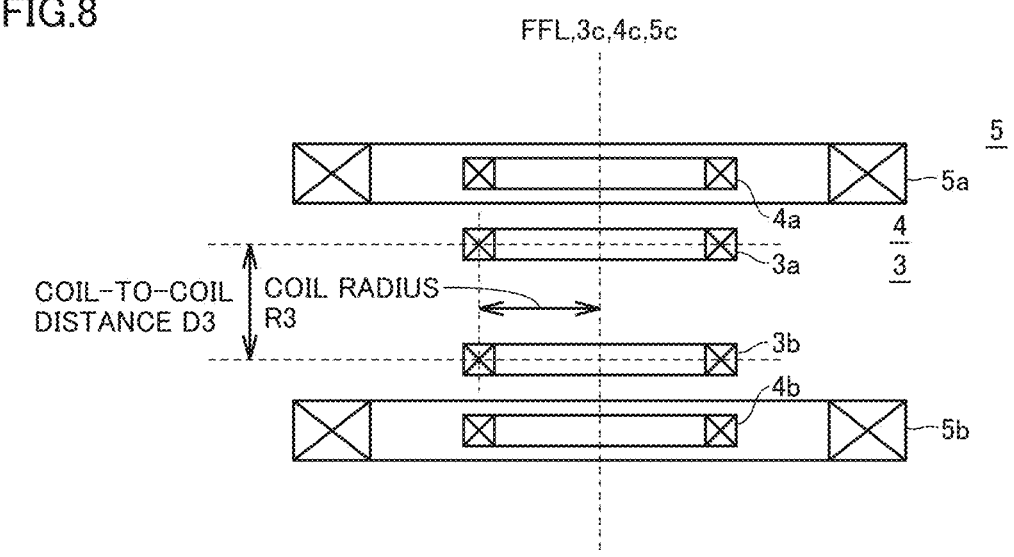
FIG. 8 is a diagram illustrating a pair of alternate-current magnetic field application coils 5, a pair of first measurement coils 3, and a pair of second measurement coils 4 of a fifth embodiment.

FIG. 8 is a diagram illustrating a pair of alternate-current magnetic field application coils 5, a pair of first measurement coils 3, and a pair of second measurement coils 4 of the fifth embodiment.

The pair of first measurement coils 3 is a Helmholtz coil. That is, a radius R3 of a first measurement coil 3a and a first measurement coil 3b is equal to a distance D3 between first measurement coil 3a and first measurement coil 3b.

As a result, uniformity of a coil sensitivity distribution in the direction of the line of linear near field-free region FFL, in other words, in a measurement region can be improved, so that a space dependence of the magnetic particles can be reduced.

Sixth Embodiment

A sixth embodiment relates to a feature that the magnetic particle imaging device of the first embodiment further has.

Figure 9:
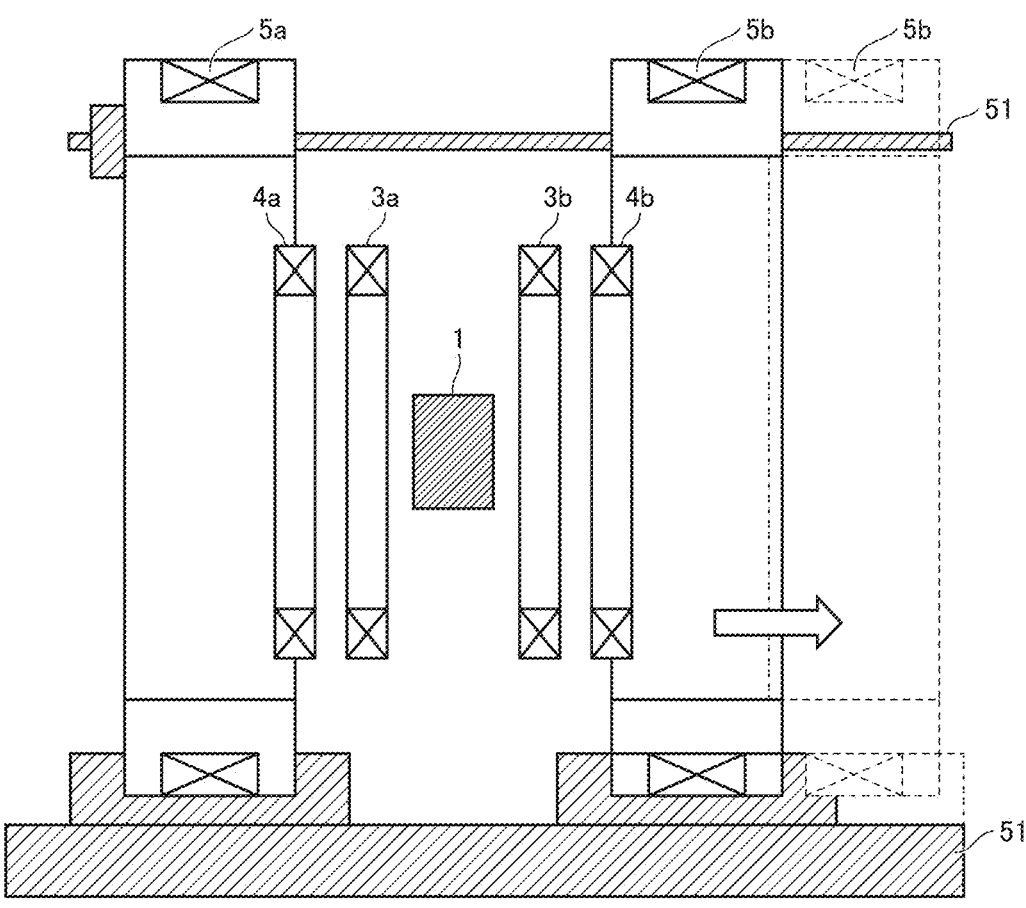
FIG. 9 is a diagram illustrating a pair of alternate-current magnetic field application coils 5, a pair of first measurement coils 3, a pair of second measurement coils 4, and a position control mechanism 51 of a sixth embodiment.

FIG. 9 is a diagram illustrating a pair of alternate-current magnetic field application coils 5, a pair of first measurement coils 3, a pair of second measurement coils 4, and a position control mechanism 51 of the sixth embodiment.

Because the pair of alternate-current magnetic field application coils 5, the pair of first measurement coils 3, and the pair of second measurement coils 4 are similar to those in the first embodiment, the description thereof will not be repeated. However, a position of an alternate-current magnetic field application coil 5b of the pair of alternate-current magnetic field application coils 5 can be changed.

Position control mechanism 51 includes, for example, a linear guide. Position control mechanism 51 can continuously change the position of alternate-current magnetic field application coil 5b in an axial direction of alternate-current magnetic field application coil 5b, in other words, in an alternate-current magnetic field application direction. As a result, a distance D1 between alternate-current magnetic field application coil 5a and alternate-current magnetic field application coil 5b can be changed.

With the present embodiment, a magnetic field interlinking the pair of first measurement coils 3 and the pair of second measurement coils 4 can be adjusted, and a signal AC1 generated in the pair of first measurement coils 3 and a signal AC2 generated in the pair of second measurement coils 4 can be adjusted as equal as possible. As a result, the detection accuracy can be higher.

In the above embodiment, the position control mechanism changes the position of alternate-current magnetic field application coil 5b of the pair of alternate-current magnetic field application coils 5 in the axial direction of alternate-current magnetic field application coil 5b, but the present invention is not limited thereto. The position control mechanism may change a position of alternate-current magnetic field application coil 5a in an axial direction of alternate-current magnetic field application coil 5a, or may change the positions of alternate-current magnetic field application coil 5a and the position of alternate-current magnetic field application coil 5b in an axial direction of the pair of alternate-current magnetic field application coils 5.

It should be understood that the embodiments disclosed herein are illustrative in all respects and are not restrictive. The scope of the present disclosure is defined not by the above description but by the claims, and is intended to include meanings equivalent to the claims and all modifications within the scope.

REFERENCE SIGNS LIST

1: magnetic particles, 2: test object, 3: pair of first measurement coils, 3a, 3b: first measurement coil, 4: pair of second measurement coils, 4a, 4b: second measurement coil, 5: pair of alternate-current magnetic field application coils, 5a, 5b: alternate-current magnetic field application coil, 6: direct-current magnetic field applicator, 10: alternate-current power supply, 11: alternate-current magnetic field applicator, 13: measurement device, 14: magnetism change measurement device, 23, 24: measurement coil, 51: position control mechanism, FFL: linear near field-free region

The invention claimed is:

1. A magnetic particle imaging device comprising:
   a pair of alternate-current magnetic field application coils to excite an alternate-current magnetic field;

a direct-current magnetic field applicator to generate a linear near field-free region such that magnetism of magnetic particles included in a test object is changed; and a magnetism change measurement device to measure a magnetism change in the magnetic particles, wherein the magnetism change measurement device includes:

a pair of first measurement coils;

a pair of second measurement coils; and a measurement device, the pair of first measurement coils is disposed so as to sandwich the magnetic particles, the pair of second measurement coils is disposed so as to sandwich the magnetic particles and the pair of first measurement coils, the pair of alternate-current magnetic field application coils is disposed so as to sandwich the magnetic particles, the pair of first measurement coils, and the pair of second measurement coils, the pair of first measurement coils, the pair of second measurement coils, and the pair of alternate-current magnetic field application coils are parallel, and the measurement device outputs a signal representing a difference between a signal measured by the pair of first measurement coils and a signal measured by the pair of second measurement coils.

2. The magnetic particle imaging device according to claim 1, further comprising a position control mechanism to change a distance between the pair of alternate-current magnetic field application coils.

3. The magnetic particle imaging device according to claim 2, wherein the position control mechanism is configured to continuously change a position of one coil constituting the pair of alternate-current magnetic field application coils in an axial direction of the one coil.

4. The magnetic particle imaging device according to claim 3, wherein directions of a central axis of the pair of alternate-current magnetic field application coils, a central axis of the pair of first measurement coils, and a central axis of the pair of second measurement coils are a first direction.

5. The magnetic particle imaging device according to claim 4, wherein a direction of a line of the linear near field-free region and the first direction are substantially parallel to each other.

6. The magnetic particle imaging device according to claim 4, wherein a direction of a line of the linear near field-free region and the first direction are substantially perpendicular to each other.

7. The magnetic particle imaging device according to claim 2, wherein directions of a central axis of the pair of alternate-current magnetic field application coils, a central axis of the pair of first measurement coils, and a central axis of the pair of second measurement coils are a first direction.

8. The magnetic particle imaging device according to claim 7, wherein a direction of a line of the linear near field-free region and the first direction are substantially parallel to each other.

9. The magnetic particle imaging device according to claim 7, wherein a direction of a line of the linear near field-free region and the first direction are substantially perpendicular to each other.

10. The magnetic particle imaging device according to claim 1, wherein directions of a central axis of the pair of alternate-current magnetic field application coils, a central axis of the pair of first measurement coils, and a central axis of the pair of second measurement coils are a first direction.

11. The magnetic particle imaging device according to claim 10, wherein a direction of a line of the linear near field-free region and the first direction are substantially parallel to each other.

12. The magnetic particle imaging device according to claim 11, wherein a direction perpendicular to the central axes is a second direction, and the test object is rotatable in a plane including the first direction and the second direction, or the pair of alternate-current magnetic field application coils, the direct-current magnetic field applicator, the pair of first measurement coils, and the pair of second measurement coils are rotatable in the plane including the first direction and the second direction.

13. The magnetic particle imaging device according to claim 11, wherein the pair of alternate-current magnetic field application coils is a Helmholtz coil.

14. The magnetic particle imaging device according to claim 10, wherein a direction of a line of the linear near field-free region and the first direction are substantially perpendicular to each other.

15. The magnetic particle imaging device according to claim 14, wherein a direction perpendicular to the central axes is a second direction, and the test object is rotatable in a plane including the first direction and the second direction, or the pair of alternate-current magnetic field application coils, the direct-current magnetic field applicator, the pair of first measurement coils, and the pair of second measurement coils are rotatable in the plane including the first direction and the second direction.

16. The magnetic particle imaging device according to claim 10, wherein the pair of alternate-current magnetic field application coils is a Helmholtz coil.

17. The magnetic particle imaging device according to claim 1, wherein the pair of alternate-current magnetic field application coils is a Helmholtz coil.

18. The magnetic particle imaging device according to claim 1, wherein a cross-sectional area of each coil of the pair of second measurement coils is smaller than a cross-sectional area of each coil of the pair of first measurement coils.

19. The magnetic particle imaging device according to claim 18, wherein a position of the pair of first measurement coils, a position of the pair of second measurement coils, the cross-sectional area of each coil of the pair of first measurement coils, and the cross-sectional area of each coil of the pair of second measurement coils are adjusted such that an interlinkage magnetic flux of the pair of first measurement coils and an interlinkage magnetic flux of the pair of second measurement coils that are caused by the alternate-current magnetic field generated by the pair of alternate-current magnetic field application coils are equal to each other.

20. The magnetic particle imaging device according to claim 1, wherein the pair of first measurement coils is a Helmholtz coil.

* * * * *